United States Patent
Wong et al.

(10) Patent No.: US 7,587,233 B2
(45) Date of Patent: Sep. 8, 2009

(54) VELOCITY-SELECTIVE ARTERIAL SPIN LABELING WITHOUT SPATIAL SELECTIVITY

(75) Inventors: Eric C. Wong, San Diego, CA (US); Thomas Liu, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 712 days.

(21) Appl. No.: 10/514,084

(22) PCT Filed: May 13, 2003

(86) PCT No.: PCT/US03/14978

§ 371 (c)(1),
(2), (4) Date: Jun. 16, 2005

(87) PCT Pub. No.: WO03/094728

PCT Pub. Date: Nov. 20, 2003

(65) Prior Publication Data

US 2005/0277825 A1 Dec. 15, 2005

Related U.S. Application Data

(60) Provisional application No. 60/378,154, filed on May 13, 2002.

(51) Int. Cl.
*A61B 5/05* (2006.01)

(52) U.S. Cl. ..................... 600/419; 600/410

(58) Field of Classification Search .................. 600/407, 600/410, 419, 413
See application file for complete search history.

(56) References Cited

U.S. PATENT DOCUMENTS

| 6,271,665 | B1 * | 8/2001 | Berr et al. ................... 324/306 |
| 6,564,080 | B1 * | 5/2003 | Kimura ...................... 600/410 |
| 2005/0277825 | A1 | 12/2005 | Wong et al. |

OTHER PUBLICATIONS

Norris et al., "Velocity Selective Radiofrequency Pulse Trains", Journal of Magnetic Resonance, vol. 137, No. 1, Mar. 1999, pp. 231-236.*
Hennig et al., "Hyperechoes", Magnetic Resonance in Medicine, vol. 46, Iss. 1, Jul. 2001, pp. 6-12.*
Alsop, D.C. and J.A. Detre, "Reduced transit-time sensitivity in noninvasive magnetic resonance imaging of human cerebral blood flow," J Cereb Blood Flow and Metab 16:1236-1249 (1996).
Davies, N.P. and P. Jezzard, "Selective arterial spin labeling (SASL): perfusion territory mapping of selected feeding arteries tagged using two-dimensional radiofrequency pulses," Magn Reson Med 2003;49(6):1133-1142 (2003).

(Continued)

*Primary Examiner*—Eric F Winakur
*Assistant Examiner*—Katherine L Fernandez
(74) *Attorney, Agent, or Firm*—Fish & Richardson P.C.

(57) ABSTRACT

Techniques for providing velocity-selective magnetic arterial spin labeling in magnetic resonance imaging (MRI) without spatial selectivity. In one implementation, an RF pulse train is applied to selectively tag spins according to velocities of the spins without selection based on locations of the spins. MRI images of tagged spins at an area of interest are then acquired to obtain information on perfusion at the area of interest.

21 Claims, 6 Drawing Sheets

OTHER PUBLICATIONS

Detre, J.A. et al., "Noninvasive Perfusion MR Imaging Using Spin Labeling Arterial Water," Chapter 15, Part V in *Diffusion and Perfusion: Magnetic Resonance Imaging: Applications to Functional MRI* (D. Le Bihan, Ed.), p. 296-305, Raven Press, New York, 1995.

Edelman, R.R. et al., "Qualitative mapping of cerebral blood flow and functional localization with echo-planar MR imaging and signal targeting with alternating radio frequency," Radiology 192: 513-520 (1994).

Garcia, D.M. et al., "Pseudo-continuous flow driven adiabatic inversion for arterial spin labeling,". Proceedings of the International Society for Magnetic Resonance in Medicine, 13: 37 (2005).

Garwood and DelaBarre, "Advances in Magnetic Resonance—the return of the frequent sweep: designing adiabatic pulses for contemporary NMR," Journal of Magnetic Resonance 153: 155-177 (2001).

Garwood et al., "Symmetric Pulses to Induce Arbitrary Flip Angles with Compensation for RF Inhomogeneity and Resonance Offsets," Journal of Magnetic Resonance 94: 511-525 (1991).

Gunther, M., "Efficient visualization of vascular territories in the human brain by cycled arterial spin labeling MRI," Magn Reson Med 56(3):671-675 (2006).

Hendrikse, J., "Flow territory mapping of the cerebral arteries with regional perfusion MRI," Stroke 35:882-887 (2004).

Henning et al., "Hyperechoes," Magnetic Resonance in Medicine 46: 6-12 (2001).

Kim, S.G. and N.V. Tsekos, "Perfusion imaging by a flow-sensitive alternating inversion recovery (FAIR) techniques: application to functional brain imaging," Magn. Reson. Med. 37: 425-435 (1997).

Kwong, K.K. et al., "Perfusion MR imaging," Proc. of the Society of Magnetic Resonance, vol. 2, Second meeting, Aug. 6-12, 1994, San Francisco, California, p. 1005.

Luh et al., "QUIPSS II with thin-slice T1 Periodic Saturation: A Method for Improving Accuracy of Quantitative Perfusion Imaging Using Pulsed Arterial Spin Labeling," Magnetic Resonance in Medicine 41: 1246-1254 (1999).

Norris, D.G. and C. Schwartzbauer, "Velocity selective Radiofrequency Pulse Trains," Journal of Magnetic Resonance 137: 231-236 (1999).

Paley, R.E.A.C., "On Orthogonal Matrices," Journal of Mathematics and Physics 12:311-320 (1932-1933).

Parry, A. & P.M. Matthews, "Functional magnetic resonance imaging (fMRI): A 'window' into the brain," Oxford University, Centre for Functional Magnetic Resonance Imaging of the Brain (2002), 42 pages, Web site: http://www.fmrib.ox.ac.uk/fmri_intro/fmri_intro.htm [originally accessed on Aug. 20, 2003].

Wang, J. et al., "Amplitude-modulated continuous arterial spin-labeling 3.0-T perfusion MR imaging with a single coil: feasibility study," Radiology 235(1):218-228 (Apr. 2005).

Werner, R. et al., "Continuous artery-selective spin labeling (CASSL)," Magn Reson Med 53(5):1006-1012 (2005).

Wong, E.C., "Vessel Encoded Arterial Spin Labeling Using Pseudo-Continuous Tagging," Proceedings of the International Society for Magnetic Resonance in Medicine 14: 668 (2006).

Wong, E.C., "Vessel-encoded arterial spin-labeling using pseudocontinuous tagging," Magnetic Resonance in Medicine 58(6): 1086-1091 (2007).

Wong, E.C. and M. Cronin, "Velocity Selective Arterial Spin Labeling using an Adiabatic Hyperecho Pulse Train." Proc. Intl. Soc. Mag. Reson. Med. 11: 2181 (2003).

Wong et al., "Velocity Selective Arterial Spin Labeling," Proc Intl. Soc. Mag. Reson. Med. 10: 621 (2002).

Wong et al., "Implementation of quantitative perfusion imaging techniques for functional brain mapping using pulsed arterial spin labeling," NMR in Biomedicine 10: 237-249 (1997).

Wong et al., "Quantitative imaging of perfusion using a single subtraction (QUIPSS and QUIPSS II)," Magn. Reson. Med. 39(5): 702-708 (1998).

Zaharchuk, G. et al., "Multislice perfusion and perfusion territory imaging in humans with separate label and image coils," Magn Reson Med 41(6):1093-1098 (1999).

Zimine, I. et al., "Dual vessel arterial spin labeling scheme for regional perfusion imaging," Magn Reson Med 56(5):1140-1144 (2006).

\* cited by examiner

VELOCITY-SELECTIVE ARTERIAL SPIN LABELING WITHOUT SPATIAL SELECTIVITY

CROSS-REFERENCE TO RELATED APPLICATIONS

This application is a national stage application of and claims the benefit of PCT Application No. PCT/US03/14978, filed on May 13, 2003, and published as WO 03/094728, which claims the benefit of U.S. Provisional Application No. 60/378,154 entitled "Perfusion Imaging Using MRI" and filed May 13, 2002, the disclosure of which is incorporated herein by reference as part of this application.

FEDERALLY SPONSORED RESEARCH OR DEVELOPMENT

The invention was made with government support under Grant Nos. NS36211 and NS36722 awarded by the National Institutes of Health (NIH). The government has certain rights in the invention.

BACKGROUND

This application relates to arterial spin labeling (ASL) in magnetic resonance imaging (MRI).

Imaging through MRI techniques is well known. In essence, a typical MRI technique produces an image of a selected body part of an object under examination by manipulating the magnetic spins of hydrogen atoms in the body part such as fat and water molecules and processing measured responses from the magnetic spins. A MRI system may include hardware to generate different magnetic fields for imaging, including a static magnetic field along a z-direction to polarize the magnetic spins, gradient fields along mutually orthogonal x, y, or z directions in a xyz coordinate system to spatially select a body part for imaging, and an RF magnetic field ($B_1$) to manipulate the spins. MRI techniques may be used to capture the functional changes in body parts or tissues such as the brain perfusion.

One commonly-used technique for functional MRI is in vivo imaging by arterial spin labeling (ASL), where the arterial blood is tagged by magnetic inversion using RF pulses applied to a plane or slab of arterial blood proximal to the tissue of interest. Images are typically acquired with and without prior tagging of arterial blood and are subtracted to produce images that are proportional to perfusion. This magnetic tagging allows for the imaging of blood flow without the administration of dyes or other imaging agents. Hence, ASL provides non-invasive tagging in MRI measurements.

Methods based on such ASL, however, are spatially selective and thus require the tagging be done at a plane or slab close to the target issues. Notably, there is a transit delay ($\Delta t$) for the delivery of tagged blood to the target tissues. This delay can be on the order of the T1 time of blood and is probably the largest source of errors in the quantitation of cerebral blood flow using ASL in the human brain. More specifically, the time for delivery of the tagged blood to the target tissues by blood flow is not short compared to the lifetime of the tracer (T1). The T1 of blood is approximately 1.3 seconds, while the delivery time in the brain is about 0 to 2 seconds in healthy subjects and may reach 5 to 10 seconds in pathological cases. Such heterogeneity of delivery time usually arises from variations in the distances and flow velocities along the vascular tree from the tagging location to the tissues of interest. In the important clinical applications such as stroke, the collateral routes of blood circulation can lead to a delivery time much larger than the time T1 and thus can cause false positive findings of low perfusion when in fact perfusion is present via collateral routes of circulation.

Such spatial selectivity and the associated delay are undesirable and are present in various available ASL methods including EPISTAR, PICORE, FAIR, QUIPPS and continuous ASL techniques. In pulsed techniques, a slab of tissue containing arterial blood is tagged, while in the continuous techniques blood flowing through a defined plane is tagged upon traversal of the plane. Pulsed and continuous techniques based on spatially dependent tagging are generally susceptible to delivery time related artifacts.

SUMMARY

In recognition of the above, this application discloses velocity selective ASL (VS-ASL) in which the tag pulse is velocity selective instead of spatially selective to mitigate adverse effects in connection with the delay in the delivery of tagged blood from the site of tagging to the tissue of interest. This allows for the tagging of all flowing spins, regardless of their physical location. Because the tag is not spatially selective, multislice and 3D acquisitions are limited only by imaging speed, and not by transit parameters.

In one implementation of VS-ASL, an RF pulse train is applied to selectively tag spins according to velocities of the spins without selection based on locations of the spins. MRI images of tagged spins at an area of interest are then acquired to obtain information on perfusion at the area of interest. RF pulse trains such as $(\alpha_i\text{-grad}_i\text{-}180\text{-grad}_i)_n\text{-}\alpha_{n+1}$ and hyperecho-based trains may be used.

In another implementation, a velocity-selective tagging RF pulse is applied to selectively tag spins according to velocities of arterial spins flowing to an area of interest without selection based on locations of the arterial spins. A first MRI image of tagged arterial spins at the area of interest is subsequently obtained. This can be used to improve the quantification of tissue perfusion using VS-ASL. A second MRI image of the same area of interest is also obtained without the velocity-selective tagging RF pulse. Next, a difference between the first and the second MRI images is used to obtain information on perfusion at the area of interest.

These and other implementations are described with greater details in the drawings, the detailed description, and the claims.

DETAILED DESCRIPTION

The VS-ASL techniques for MRI measurements in this application may be used much more effectively than the spatially selective ASL techniques in a variety of clinical applications including acute stroke. In general, the present techniques tag arterial blood with velocity selective, rather than spatially selective, RF pulses. As a result, nearly all arterial blood can be tagged irrespective of location. This non-spatial selection in tagging brings the tag much closer to the target tissues for the entire brain. In comparison, the conventional ASL techniques are known to fail in the presence of long delivery times and are difficult to improve over many slices. By contrast, in the non-spatially-selective VS-ASL techniques of this application, the delivery delay should be small everywhere, and the technique is explicitly independent of the location of the imaging slices.

In preferred implementations, velocity selective tagging may be accomplished using an RF/gradient pulse train that saturates or inverts magnetization of the spins in the flow traveling above a cut-off velocity $V_c$, without perturbing the spins that are moving slower than $V_c$. Typically, the cut-off velocity $V_c$ may be set on the order of 1 cm/s in some applications.

A typical VS-ASL RF pulse sequence may be applied as follows. First, a velocity-selective tagging RF pulse is applied to modify the magnetization of inflowing arterial spins. Second, a delay of a duration of the $T_I$ time (i.e., a time on the order of the $T_1$ of blood, which is approximately 1-2 seconds) is permitted to allow for inflow to reach the target issues. Upon expiration of the delay, a rapid image acquisition is performed to acquire an image of a region of interest. This is alternated across the repetition time TR periods with images in which flowing spins have not been tagged. The two images are subtracted to obtain an image that reflects only the blood that has flowed in the region of interest.

Figure 1A:
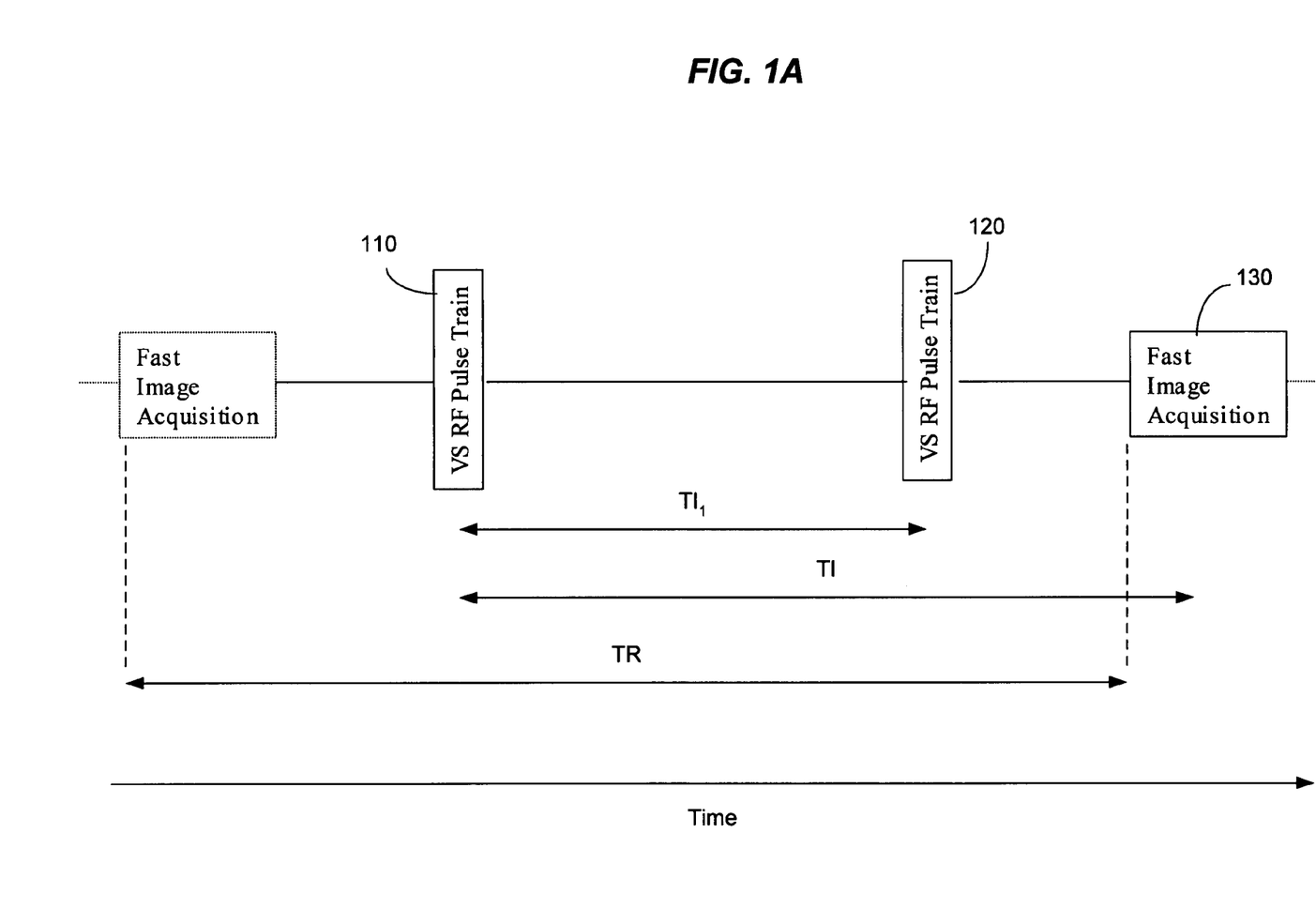
FIGS. 1A and 1B illustrate two exemplary implementations of velocity selective arterial spin labeling without spatial selectivity.
Figure 1B:
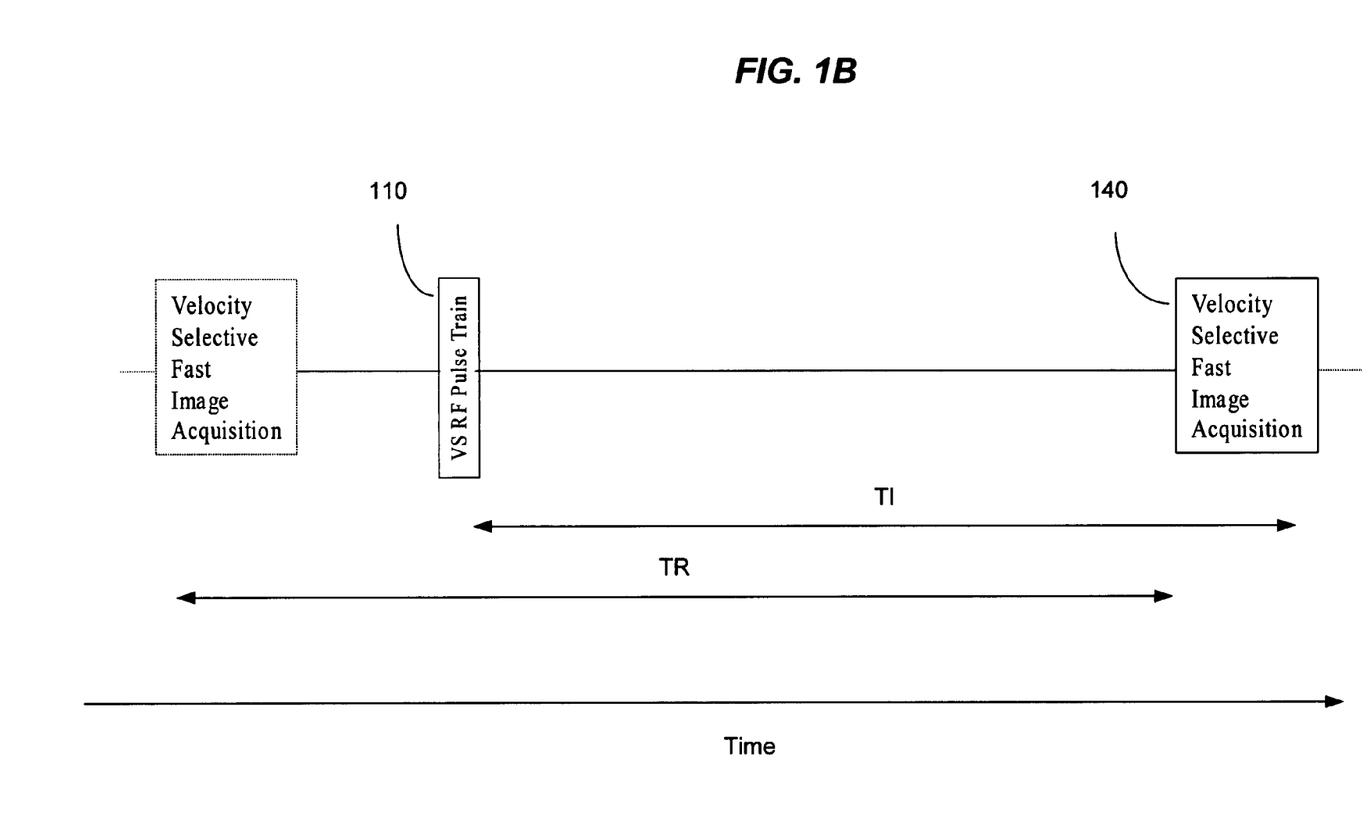

FIGS. 1A and 1B respectively illustrate two techniques for improving the quantitation of perfusion using velocity selective ASL without the spatial selectivity. FIG. 1A illustrates the first technique using pulsed ASL. During one cycle within the imaging repetition time TR, three pulse trains are applied to the target area for the MRI imaging. Initially, a VS-ASL RF pulse train 110 is applied to tag spins with a velocity selectivity without selection based on spin locations. After a time $TI_1$ which is less than the time TI, a second VS-ASL RF pulse train 120 is applied to destroy the signal from spins that are still moving faster than the cutoff velocity $V_c$. After the second VS-ASL pulse train 120 within a time less than TI from the application of the first VS-ASL pulse train 110, a third pulse train 130 for a fast image acquisition is applied to acquire the image of the target area. This completes one imaging cycle to get a velocity selective MRI image of the target. In the next imaging cycle, a MRI image is acquired with the fast image acquisition without the tagging pulse train 110 and the velocity selective pulse train 120. The difference between the two images provides the information of the perfusion in the target area.

Application of the second VS-ASL pulse train 120 limits the signal only to those spins that decelerated from a velocity higher than $V_c$ to a velocity lower than $V_c$ in the time $TI_1$, and performs two functions. First, it restricts the temporal length of the tagged bolus to $TI_1$. This in turn generates an ASL signal that is proportional to the product of perfusion and $TI_1$, and makes it possible to quantify the absolute level of perfusion. Second, it eliminates the signal from veins, as blood in veins is accelerating rather than decelerating. This modification has been implemented in the form of a second identical velocity selective pulse at time $TI_1$ after the application of the tag pulse. The ASL signal produce by this technique is proportional to $CBF*TI_1$.

FIG. 1B shows the second technique using pulsed ASL to image only spins with velocities below $V_c$. Different from the first technique in FIG. 1A, only two pulse trains are applied in each imaging cycle. The first tagging pulse train 110 is similar to that in FIG. 1A. Instead of applying the pulse trains 120 and 130 within the time TI, a pulse train 140 is applied within a time less than TI to perform a velocity selective fast image acquisition. Hence, different from the pulse train 130 which performs only the fast image acquisition, the pulse train 140 is designed to perform a fast image acquisition with a velocity selectivity to select only tagged spins with a velocity below the cutoff Vc to image. This VS fast image acquisition pulse may be implemented with a suitable VS pulse train, such as a bipolar velocity sensitive gradient pulses (90-degree pulse followed with two bipolar gradient pulses with opposite phases) or other set of velocity sensitive gradient pulses during image acquisition. This approach, when combined with a single shot imaging technique, has the advantage of being insensitive to the phase shifts that arise from gross patient motion during application of velocity sensitive preparation pulses.

Various velocity-selective RF pulse trains may be used to implement the above VS-ASL techniques. Computer optimization techniques may be used to develop or identify RF pulse trains with desired velocity selectivity over a wide range of velocities.

Figure 2A:
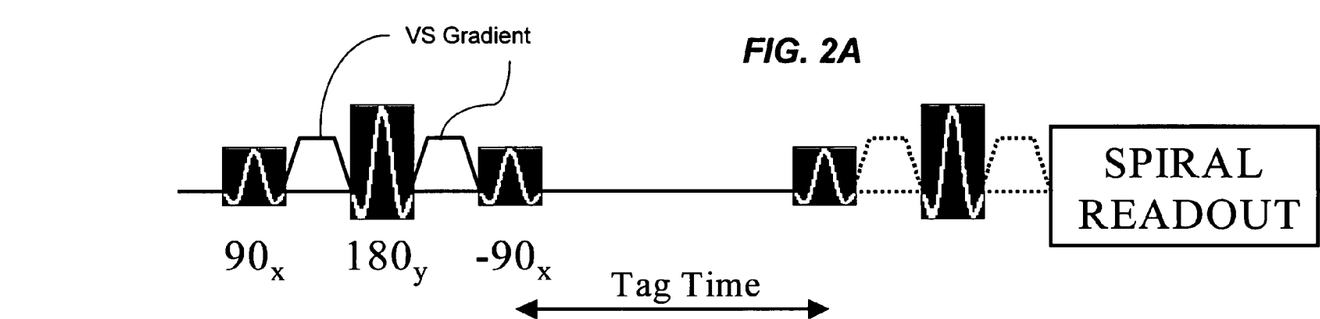
FIGS. 2A and 2B illustrate one exemplary RF pulse train suitable for the velocity selective ASL of this application.
Figure 2B:
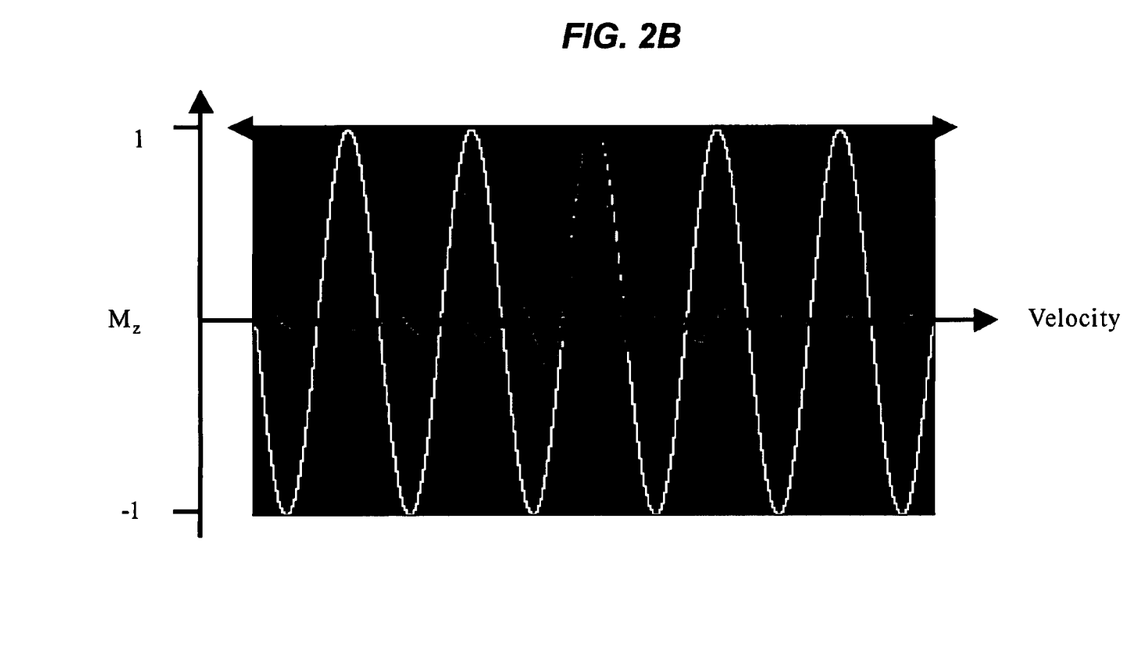

For example, a $90_x$–grad–$180_y$–grad–$90_{-x}$ pulse train was tested to exhibit an approximately sinc-shaped magnetization profile ($M_z$) as a function of velocity in the presence of laminar flow. A VENC (velocity decoding speed) of approximately 1-cm/s tags spins down to the level of approximately 50-μm vessels, which should be close to the target tissue. The control pulse is the same train with the gradients turned off. FIG. 2A shows two sequential pulse trains with and without the RF tagging gradient pulses for taking the images. FIG. 2B shows the velocity selectivity caused by the VS-ASL with the $90_x$–grad–$180_y$–grad–$90_{-x}$ pulse train in FIG. 2A.

In order to quantify cerebral blood flow (CBF), it is desirable to control or measure the temporal width of the bolus of tagged blood that is being delivered to the tissue. One method for the quantification of CBF is to introduce the velocity selectivity into the image acquisition using flow weighting gradients. If the flow weighting gradients in the imaging sequence have the same velocity cutoff ($V_c$) as the tag pulse, and the tagged arterial blood is decelerating monotonically, then only blood that decelerates through this cutoff velocity $V_c$ during TI will contribute to the ASL signal, and the ASL signal will be proportional to CBF*TI. The condition for this approach is that the velocity cutoff $V_c$ is sufficiently small that the deceleration through that velocity $V_c$ occurs within the imaging voxel. This technique is referred herein as quantitative VS-ASL (QVS-ASL). Imaging techniques for acquiring MRI images without a velocity selective readout are labeled non-quantitative ASL (NQVS-ASL).

Figure 3A:
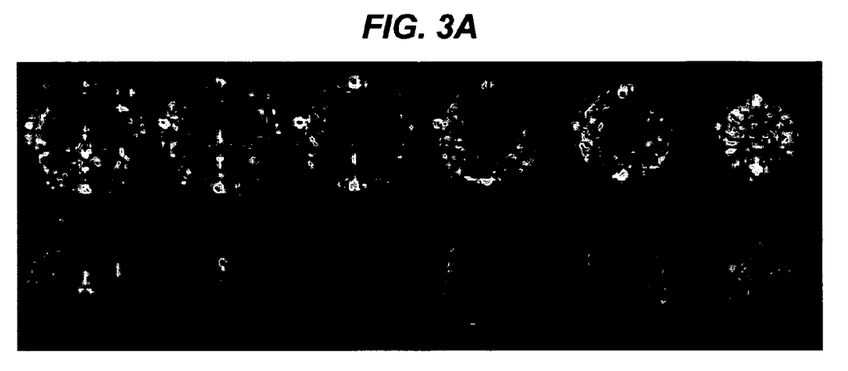
FIGS. 3A, 3B, and 3C show exemplary MRI images obtained using the RF pulse train in FIG. 2A.
Figure 3B:
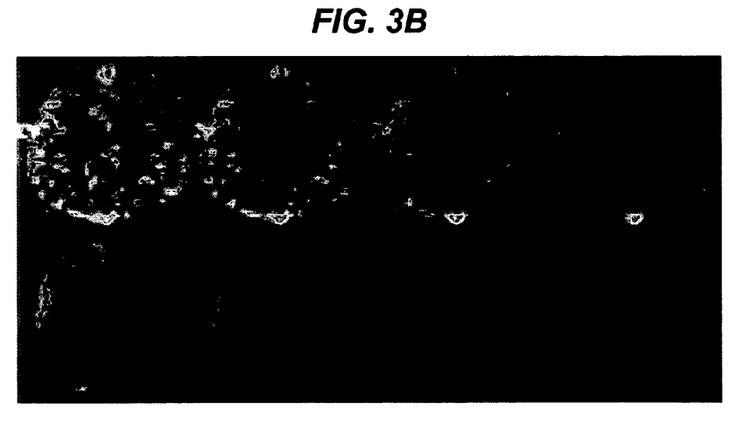
Figure 3C:
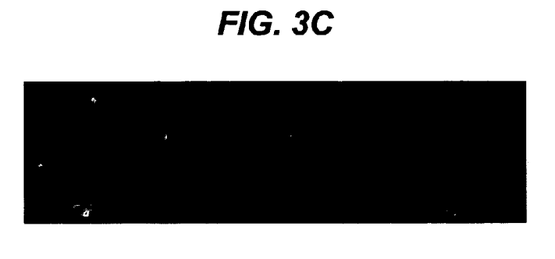

FIGS. 3A, 3B, and 3C illustrate MRI images obtained from healthy volunteers by using a 1.5T GE LX MRI system. A single shot spiral readout at 64×64 resolution, with a field of view (FOV) about 24 cm by 8 mm. Multislice images were acquired sequentially from proximal to distal, with a delay of approximately 60 ms between images. FIG. 3A shows the multislice VS-ASL images where the top images are NQVS-ASL images and the bottom images are QVS-ASL images with TI from about 600 ms to about 900 ms. FIG. 3B shows VS-ASL images at different TI times of 700 ms, 800 ms, 1100 ms, and 1300 ms from left to right. The top row shows the NQVS-ASL images and the bottom row shows the QVS-ASL images. FIG. 3C further shows PICORE QUIPSS II and three QVS-ASL images at TI of about 1100 ms and VENC at 0.5, 1.0. and 2.0 cm/s, respectively.

Other exemplary pulse trains suitable for VS-ASL of this application include pulse trains of $(\alpha_i-grad_i-180-grad_i)_n-\alpha_{n+1}$, and hyperecho-based trains. When $\alpha_i$ is set at 90 degrees, the pulse train of $(\alpha_i-grad_i-180-grad_i)_n-\alpha_{n+1}$ is a spin echo pulse train. In general, $\alpha_i$ may be set to other angles. Based on Bloch equation simulations, it appears that the hyperecho based trains are more time efficient. This is presumably because the off-resonance insensitivity is provided by a single 180° pulse at the center of the train in the hyperecho trains, as opposed to multiple 180° pulses.

Figure 4:
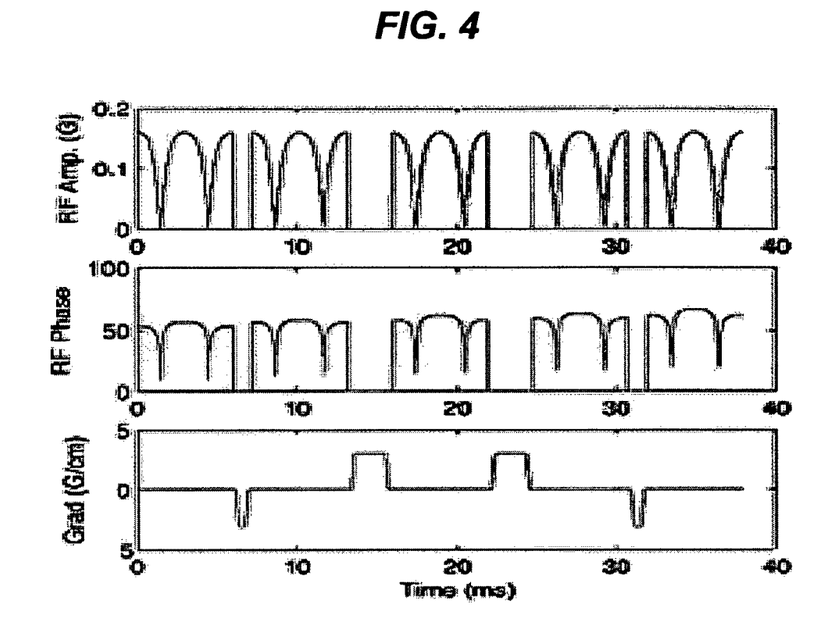
FIG. 4 shows one exemplary hyperecho pulse train for implementing the VS-ASL technique of this application.

In particular, velocity selective hyperecho pulse trains of the form of $(\alpha_i-grad_i)_n-180-(-\alpha_{n+1-i}-grad_{n+1-i})_n$ may be designed using the Nelder-Mead simplex method to optimize the $\alpha i$, their phases, and the area of the gradients. The error function is the mean squared difference between the velocity profile and an ideal rectangular profile with a velocity cutoff at $V_c=1$ cm/s. For B1 insensitivity, BIR-4 pulses described in Journal of Magnetic Resonance, Vol. 94, page 511 (1991) by Garwood et al. with $tan(\kappa)=3$, $\zeta=3$ and a width of 6 ms were used for all pulses. This class of RF pulses provides for accurate plane rotation of all spins over a broad range of $B_1$ field intensities. For optimizations, T1 and T2 were assumed to be 1000 ms and 100 ms, respectively, and pulse trains with n=2 (5 RF pulses total) were found to be optimal, as improvements in the shape of the profile with higher n were offset by increased T2 decay during the pulse. The hyperecho pulse train is not constrained to a beginning with a 90° pulse because this beginning with a 90° pulse may unnecessarily reduce the degrees of freedom for the optimization.

If the final RF pulse is set to $-\alpha_1$ (with phase $-\phi_1$), then static magnetization will be left inverted. If it is set to $180°-\alpha_1$ (with phase $-\phi_1$), then static magnetization will be returned to the +Z axis. Either of these can be used for VS-ASL because each of the above two final RF pulses results in the same difference in Mz between static and flowing spins. The inverted case naturally results in at least partial suppression of the static tissue signal to reduce noise in the time series and the dynamic range of the signal, which can be useful for high dynamic range imaging methods such as volume acquisitions.

Figure 5:
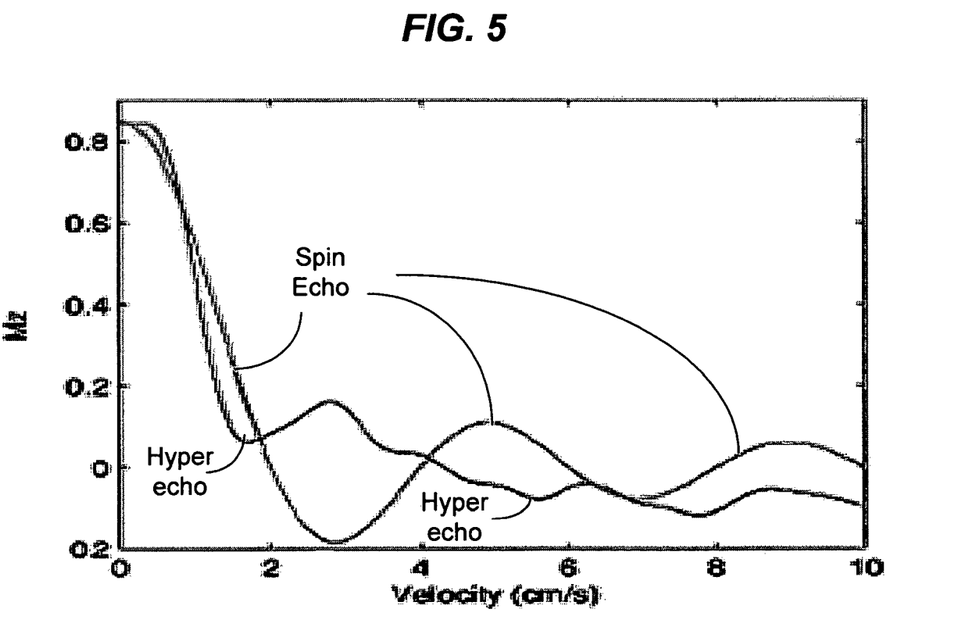
FIG. 5 shows the velocity profile for the hyperecho pulse train in FIG. 4 in comparison with that for the spin echo pulse train shown in FIG. 2A.
Figure 6:
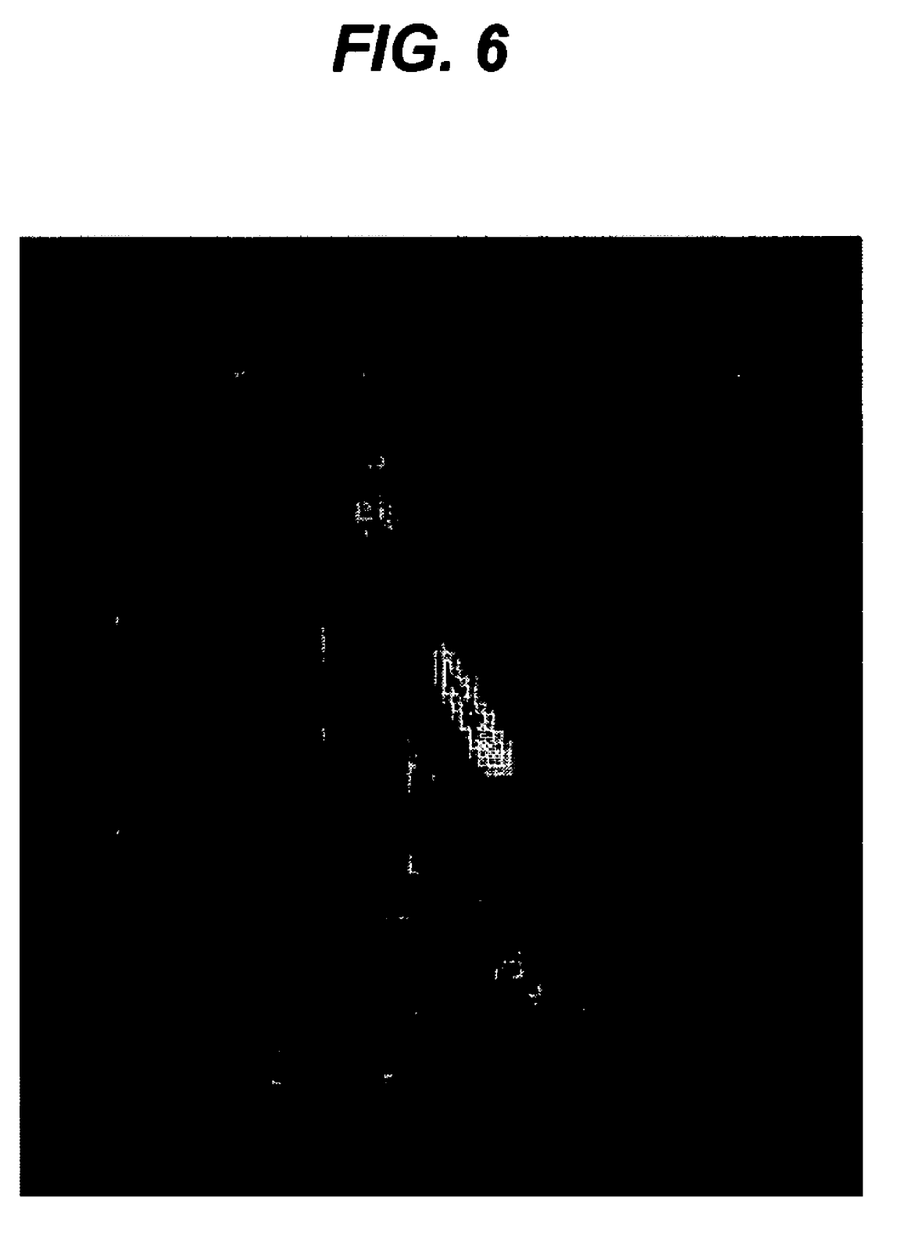
FIG. 6 shows an exemplary acquired VS-ASL image at 3 T using the hyperecho pulse train in FIG. 4.

FIG. 4 shows an optimized hyperecho pulse train as one example. Parameters of this pulse are: $\alpha=\{58.2, -94.1, 180, 94.1, -58.2\}°$, $\phi=\{86.0°, -113.6, 0, 113.6, -86.0\}°$, gradient durations are $\{0.79, 2.37, 0.79, 2.34\}$ms, using trapezoidal gradients of 3 G/cm amplitude and ramps slewed at 14 G/cm/ms. Note that the phase and amlitude of the RF pulse are nonlinear functions of time. FIG. 5 shows a calculated velocity profile for this pulse for the non-inverted pulse train where the sinc profile of a spin echo VS pulse is shown for comparison., FIG. 5 also illustrates the improved sharpness of the velocity cutoff, as well as the flatter profile near zero velocity. FIG. 6 shows an example VS-ASL image acquired in 200 s on a Varian 3 T scanner using a single shot EPI readout.

The velocity profile of the hyperecho based velocity selective pulse train is greatly improved relative to a simple spin echo based pulse train. The use of B1 insensitive pulses was found to be critical for hyperecho based pulse trains, as they were found to be exquisitely sensitive to both B1 and resonance offset when implemented using linear pulses. This is particularly important for implementation at higher fields.

Both B1 insensitive RF pulses and RF pulses insensitive to the resonance offset are applications of adiabatic rapid passage techniques in MRI systems. Some adiabatic rapid passage techniques are described, e.g, by Garwood and Dela-Barre in "Advances in Magnetic Resonance—the Return of the Frequency Sweep: Designing Adiabatic Pulses for Comtempary NMR," Journal of Magnetic Resonance, Vol. 153, pages 155-177(2001) and Journal of Magnetic Resonance, Vol. 94, page 511 (1991) by Garwood et al. In the VS-ASL techniques of this application, the phase, frequency, amplitude, or a combination of these parameters of the RF pulses may be varied in an adiabatic manner to allow the spins to follow such an adiabatic variation. Such adiabatic rotations are rapid relative to the relations times T1 and T2 of the spins. Hence, the B1 insensitive RF pulses may be designed to adiabatically change its RF frequency with time, or change its phase in a nonlinear manner with respect to time, to allow for efficient MRI acquisitions with a high degree of tolerance to a variation in the B1 field, e.g., its amplitude above a certain threshold amplitude, or its spatial inhomogeneity. Similarly, the RF frequency of the RF pulses may be swept in an adiabatic manner in a range that includes the Larmor frequency of the spins to allow for tolerance to a resonance offset from the Larmor frequqency in MRI.

The above VS-ASL techniques are amenable to 3-dimensional and multislice imaging applications. Such techniques may be used for imaging in a number of settings including, but not limited to stroke and other cerebrovascular diseases, perfusion deficit in brain disorders such as Alzheimers and schizophrenia, functional brain imaging in both clinical as in neurosurgical planning and epilepsy and in basic research settings, myocardial ischemia and other ischemic diseases in other organs including lung, kidney and muscle.

Only a few implementations are disclosed. However, it is understood that variations and enhancements may be made without departing from the spirit of and are intended to be encompassed by the following claims.

What is claimed is:

1. A method for magnetic arterial spin labeling in magnetic resonance imaging (MRI), comprising:
    applying at an MRI system an RF pulse train to selectively tag spins according to velocities of the spins without selection based on locations of the spins;
    applying at the MRI system a second velocity selective pulse train after the tagging RF pulse train to destroy a signal from spins that are still moving faster than a cut off velocity; and
    obtaining at the MRI system MRI images of tagged spins at an area of interest to obtain information on perfusion at the area of interest.

2. The method as in claim 1, wherein the RF pulse train includes a pulse train in a form of $90_x-grad-180_y-grad-90_{-x}$ where z is long a direction of a static-magnetic field for the MRI in a xyz coordinate system.

3. The method as in claim 1, wherein the RF pulse train is a hyperecho pulse train.

4. The method as in claim 3, wherein the hyperecho pulse train is configured to be insensitive to an RF field $B_1$ in MRI.

5. The method as in claim 1, wherein the RF pulse train includes a pulse train in a form of $(\alpha_i-grad_i)_n-180-(-\alpha_{n+1-i}-grad_{n+1-i})_n$ where z is long a direction of a static-magnetic field for the MRI in a xyz coordinate system.

6. The method as in claim 1, further comprising obtaining at the MRI system a 3-dimensional MRI image based on the tagging according to velocities of the spins without selection based on locations of the spins.

7. The method as in claim 1, further comprising obtaining at the MRI system multislice MRI images based on the tagging according to velocities of the spins without selection based on locations of the spins.

8. The method as in claim 1, wherein the RF pulse train is configured to be insensitive to a resonance offset.

9. The method as in claim 1, further comprising applying at the MRI system a second velocity selective pulse train which is added between the tagging pulse train and the image acquisition to improve the quantitation of perfusion.

10. The method as in claim 1, wherein MRI images are acquired with a velocity selective pulse train to improve the quantitation of perfusion.

11. The method as in claim 10, wherein the velocity selective pulse train for image acquisition includes bipolar gradient pulses.

12. A method for magnetic arterial spin labeling in magnetic resonance imaging (MRI), comprising:
    applying at a MRI a velocity-selective tagging RF pulse train to selectively tag spins according to velocities of arterial spins flowing to an area of interest without selection based on locations of the arterial spins;
    obtaining at the MRI a first MRI image of tagged arterial spins at the area of interest;
    obtaining a second MRI image of the area of interest without the velocity-selective tagging RF pulse;
    obtaining at the MRI system a difference between the first and the second MRI images to obtain information on perfusion at the area of interest; and
    applying at the MRI system a second velocity selective pulse train between the tagging RF pulse train and the acquisition of the first MRI image to improve the quantitation of perfusion.

13. The method as in claim 12, wherein the RF pulse train includes a pulse train in a form of $90_x$–grad–$180_y$–grad–$90_{-x}$ where z is long a direction of a static magnetic field for the MRI in a xyz coordinate system.

14. The method as in claim 12, wherein the RF pulse train is a hyperecho pulse train.

15. The method as in claim 14, wherein the hyperecho pulse train is configured to be insensitive to an RF field $B_1$ in MRI.

16. The method as in claim 12, wherein the RF pulse train includes a pulse train in a form of $(\alpha_i-\text{grad}_i)_n-180-(-\alpha_{n+1-i}-\text{grad}_{n+1-i})_n$ where z is long a direction of a static magnetic field for the MRI in a xyz coordinate system.

17. The method as in claim 12, further comprising obtaining at the MRI system a 3-dimensional MRI image based on the tagging according to velocities of the spins without selection based on locations of the spins.

18. The method as in claim 12, further comprising obtaining at the MRI system multislice MRI images based on the tagging according to velocities of the spins without selection based on locations of the spins.

19. The method as in claim 12, wherein MRI images are acquired with a velocity selective pulse train to improve the quantitation of perfusion.

20. The method as in claim 19, wherein the velocity selective RF pulse train for image acquisition includes bipolar gradient pulses.

21. The method as in claim 12, wherein the RF pulse train is configured to be insensitive to a resonance offset.

* * * * *

UNITED STATES PATENT AND TRADEMARK OFFICE
CERTIFICATE OF CORRECTION

PATENT NO. : 7,587,233 B2
APPLICATION NO. : 10/514084
DATED : September 8, 2009
INVENTOR(S) : Eric C. Wong et al.

It is certified that error appears in the above-identified patent and that said Letters Patent is hereby corrected as shown below:

IN THE CLAIMS:

Column 6, lines 41-42 (Claim 1), delete "cut off" and insert --cutoff--;

Column 6, line 48 (Claim 2), delete "static-magnetic" and insert --static magnetic--;

Column 6, line 56 (Claim 5), delete "static-magnetic" and insert --static magnetic--;

Column 7, line 13 (Claim 12), after "MRI" insert --system--;

Column 7, line 17 (Claim 12), after "MRI" insert --system--;

Column 7, line 19 (Claim 12), after "obtaining" insert --at the MRI system--;

Column 8, line 1 (Claim 13), delete "long" and insert --along--;

Column 8, line 10 (Claim 16), delete "long" and insert --along--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,587,233 B2 Page 1 of 1
APPLICATION NO. : 10/514084
DATED : September 8, 2009
INVENTOR(S) : Wong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1097 days.

Signed and Sealed this

Fourteenth Day of December, 2010

David J. Kappos
*Director of the United States Patent and Trademark Office*